United States Patent
Koga et al.

(10) Patent No.: US 6,426,469 B2
(45) Date of Patent: Jul. 30, 2002

(54) PRINTED BOARD WITH SIGNAL WIRING PATTERNS THAT CAN MEASURE CHARACTERISTIC IMPEDANCE

(75) Inventors: Yuichi Koga, Hachioji; Takahiro Deguchi, Yokohama; Shigeo Nakamura, Kawasaki, all of (JP)

(73) Assignees: Kabushiki Kaisha Toshiba, Kawasaki; Ajinomoto Co., Inc.; Victor Company of Japan Limited, both of Tokyo, all of (JP)

( * ) Notice: Subject to any disclaimer, the term of this patent is extended or adjusted under 35 U.S.C. 154(b) by 0 days.

(21) Appl. No.: 09/771,600

(22) Filed: Jan. 30, 2001

(30) Foreign Application Priority Data

Jan. 31, 2000 (JP) ........................................ 2000-022656

(51) Int. Cl.[7] .............................................. H01R 12/04
(52) U.S. Cl. ........................ 174/262; 174/255; 174/257; 361/794
(58) Field of Search .................... 174/261, 255, 174/256, 257; 361/780, 777, 778, 779, 792, 793, 794, 795

(56) References Cited

U.S. PATENT DOCUMENTS

| | | | | |
|---|---|---|---|---|
| 4,854,038 A | * | 8/1989 | Wiley ........................ | 29/830 |
| 5,337,466 A | * | 8/1994 | Ishida ........................ | 29/830 |
| 5,466,892 A | * | 11/1995 | Howard et al. .............. | 174/261 |
| 5,568,107 A | | 10/1996 | Buuck et al. | |
| 5,719,750 A | * | 2/1998 | Iwane ........................ | 361/794 |
| 5,736,679 A | * | 4/1998 | Kresge et al. .............. | 174/250 |
| 6,184,477 B1 | * | 2/2001 | Tanahashi .................... | 174/261 |
| 6,236,572 B1 | * | 5/2001 | Teshome et al. ............ | 361/794 |

* cited by examiner

*Primary Examiner*—Kamand Cuneo
*Assistant Examiner*—Jose' H. Alcala
(74) *Attorney, Agent, or Firm*—Finnegan, Henderson, Farabow, Garrett, & Dunner, L.L.P.

(57) ABSTRACT

A plain layer in a forming area of a measuring wiring pattern is patterned so that its copper-containing amount may be coincided with a copper-containing amount in a forming area of a measurement target signal wiring pattern. Thereby, it is possible to coincide a thickness of an insulating layer in the forming area of the measuring wiring pattern with a thickness of the insulating layer in the forming area of the measurement target signal wiring pattern, thus reducing a measuring error of the characteristic impedance based on a difference of a thickness of the insulating layer. Using the measuring wiring pattern, it is possible to measure a correct characteristic impedance of the measurement target signal wiring pattern.

9 Claims, 3 Drawing Sheets

PRINTED BOARD WITH SIGNAL WIRING PATTERNS THAT CAN MEASURE CHARACTERISTIC IMPEDANCE

CROSS-REFERENCE TO RELATED APPLICATIONS

This application is based upon and claims the benefit of priority from the prior Japanese Patent Application No. 2000-022656, filed Jan. 31, 2000, the entire contents of which are incorporated herein by reference.

BACKGROUND OF THE INVENTION

The present invention relates to a print board, and more particularly to a print board including a measuring wiring pattern for measuring a characteristic impedance of a measurement target signal wiring pattern.

In a print board used for an electronic circuit of an operational frequency of over 100 MHz, and particularly used for implementing an RF circuit for a wireless communication and Direct-RDRAM or the like of Rambus Co., it is important to control a characteristic impedance of a signal wiring pattern. For this reason, a measuring wiring pattern for measuring the characteristic impedance of the signal wiring pattern is provided.

This measuring wiring pattern is a linear pattern for measurement only and has a length of more than a predetermined length which is prescribed for a measurement of the characteristic impedance. (1) a width of the wiring pattern (copper), (2) a thickness of the wiring pattern, (3) a dielectric constant of an insulating layer, (4) a thickness of the insulating layer, and (5) a type of line (microstrip line structure or strip line structure) are usually considered as factors for deciding the characteristic impedance of the linear pattern.

Therefore, by coinciding a width of the measuring wiring pattern with that of a signal line of the measurement target signal wiring pattern, a characteristic impedance of the measurement target signal wiring pattern can be investigated from a result of the characteristic impedance of a measuring wiring pattern.

Nevertheless, in a practical print board, a thickness of the insulating layer in item (4) is often not uniform and the thickness of the insulating layer beneath the measurement target signal wiring pattern does not coincide with that of the insulating layer beneath the measuring wiring pattern. Since the insulating layer is formed on a patterning conductive layer (plain layer for a power source or a ground), the thickness of the insulating layer which is formed on the conductive layer changes subtly according to a patterning form of the conductive layer.

Therefore, as a coincidence of only a pattern width is used in a prior art, a subtle change of the pattern width affects the result of measurement, so it is difficult practically to measure the characteristic impedance correctly.

When the measuring wiring pattern is arranged on a periphery of the print board, a sacrificed portion of a print board outside the product or the like, a thickness of the insulating layer is different between beneath the measuring wiring pattern and beneath the measurement target signal wiring pattern. In the periphery or sacrificed portion, as the plain layer is beforehand scraped the side off in order not to expose outward, the insulating layer of that portion is usually made thinner than the inner side of the print board.

BRIEF SUMMARY OF THE INVENTION

Accordingly, it is an object of the present invention to provide a print board in which it is possible to correctly measure a characteristic impedance of a measurement target signal wiring pattern with reducing the measuring error of a characteristic impedance based on a difference of a thickness of an insulating layer.

According to the present invention, a print board is formed by forming an insulating layer on a patterned conductive layer and forming a wiring pattern layer on the insulating layer. A measuring wiring pattern for measuring the characteristic impedance of a measurement target signal wiring pattern in the wiring pattern layer is provided on the wiring pattern layer, and the conductive layer is patterned so that a containing percent of a conductive material per unit area of the conductive layer become approximately the same in a forming area of the measurement target signal wiring pattern and in a forming area of the measuring wiring pattern.

In this print board, since the conductive layer is so patterned that a containing amount of the conductive material per unit area of the conductive layer becomes approximately the same between in the forming area of the measurement target signal wiring pattern and in the forming area of the measuring wiring pattern and the insulating layer is formed on the conductive layer, a thickness of the insulating layer in the measuring wiring pattern forming area can be coincided with a thickness of the insulating layer in an actual signal line (measurement target signal wiring pattern) forming area.

Therefore, a measuring error of the characteristic impedance due to a difference of a thickness of the insulating layer can be reduced, and using the measuring wiring pattern, the characteristic impedance of the measurement target signal wiring pattern can be correctly measured.

Further, in order to make a containing amount of the conductive material in the neighborhood of the forming area of the measuring wiring pattern the same as a containing amount of a conductive material in the neighborhood of the forming area of the measurement target signal wiring pattern, an arbitrary shaped or formed conductive material removal area is formed in a conductive layer in the neighborhood of a forming area of the measuring wiring pattern and a containing amount of a conductive material in the conductive layer is adjusted. For example, it is preferable that a via hole for a pseudo interlayer hole or a through hole may be arranged or a cutout portion may be formed.

When the measuring wiring pattern is formed on a periphery of the print board, a conductive material removal area is formed only on the inner side of the print board with regard to the measuring wiring pattern. Thereby, it is possible to reduce an area of a necessary conductive material removal area and a layout which is preferable to a high density packaging can be realized.

If a clearance diameter for an interlayer hole or a through hole formed in the conductive layer in the neighborhood of the forming area of the measurement target signal wiring pattern is set to the smaller value than a clearance diameter for an interlayer hole or a through hole formed in the conductive layer in the neighborhood of a forming area of other wiring pattern, a difference between a containing amount of the conductor material in the neighborhood of the forming area of the measurement target signal wiring pattern and a containing amount of the conductive material in the neighborhood of the forming area of the measuring wiring pattern may be small. This structure can be utilized individually, but may be used in combination with a structure provided with the conductive material removal area.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

A preferred embodiment of a print board according to the present invention will now be described with reference to the accompanying drawings.

Figure 1:
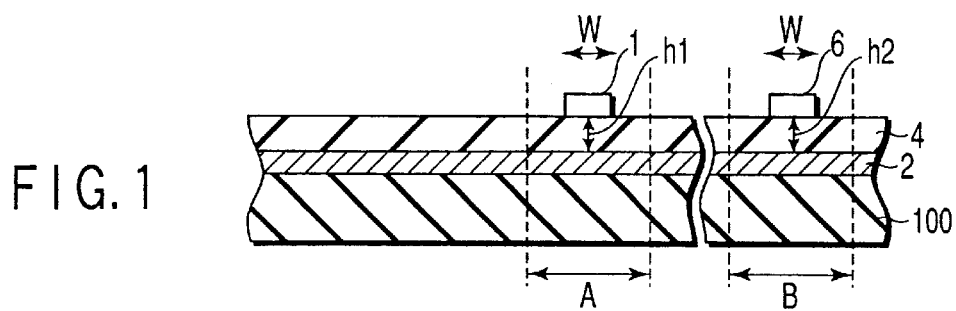
FIG. 1 is a view for explaining a sectional structure of a print board according to an embodiment of the present invention.

FIG. 1 shows a cross-sectional structure of a print board according to an embodiment of the present invention. In this print board, an object of use may be quite all right. For example, it can be used for an RF circuit for a wireless terminal such as a cordless telephone, for a memory module board for Direct-RDRAM of Rambus Co., and for a system board of a computer. When used for the electronic circuit for a high speed signal transmission, it is required a strict impedance control. Hereinafter, taking a microstrip line structure which is preferable to a high speed signal transmission, as an example, a structure of the print board of the invention will be described.

As shown in FIG. 1, on a core 100 made of an insulating substrate, a mat layer of copper foil (plain layer) 2 used for a power source or a grounded layer, is formed. Though not shown in FIG. 1, the plain layer 2 is patterned to form a slit for separation of the power source/ground, an interlayer hole or a through hole and an insulating layer 4 is formed on a patterned plain layer 2.

Further, a wiring pattern layer for forming a signal wiring pattern is formed on the insulating layer 4. In the wiring pattern layer, a signal wiring pattern 1 of a measurement target (or a measurement target signal wiring pattern) and a measuring wiring pattern 6 for measuring its characteristic impedance are formed.

A plurality of measurement target signal wiring patterns 1 are formed and can be classified into several kinds of wiring pattern groups according to a difference of a pattern width. A layout structure of each signal wiring pattern is often common in accordance with each kind. For example, as each wiring pattern of signal wiring patterns forming a memory bus line are similar each other and a pattern width is common, and if a representative signal wiring pattern is made the measurement target signal wiring pattern 1, a characteristic impedance of each signal wiring pattern which is used as a memory bus line can be measured by the measuring wiring pattern 6. Then, a pattern width W of the measuring wiring pattern 6 is coincided with a pattern width W of the signal line group which becomes the measurement target signal wiring pattern 1.

Further, in the present embodiment, a thickness h1 of the insulating layer 4 in a forming area A of the measurement target signal wiring pattern 1 is designed to coincide with a thickness h2 of the insulating layer 4 in a forming area B of the measuring wiring pattern 6. This can be realized by coinciding a copper-containing amount of the plain layer 2 in the area A with that in the area B. A copper-containing amount is referred to as a containing amount of a copper foil per unit area in the plain layer 2 after patterning. As the insulating layer 4 is formed on the plain layer 2 after being patterned, the copper-containing amounts of the areas A and B are coincided and a film thickness of the insulating layer 4 of the areas A and B can be set as approximately the same.

Next, referring to FIG. 2, the measuring wiring pattern 6 will be described.

Figure 2:
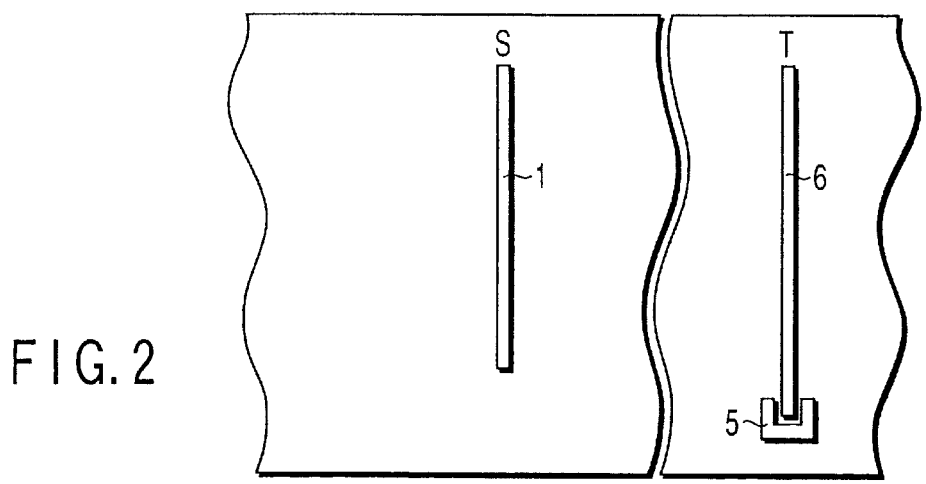
FIG. 2 is a view for explaining a measuring wiring pattern in use for the print board of the embodiment.

FIG. 2 is a view which the print board is observed from upward. In order to measure a characteristic impedance of the measurement target signal wiring pattern 1, it is necessary to be provided with the measuring wiring pattern 6 having some extent of length and a pad (ground) 5 having a reference potential. Irrespective of a pattern length of the measurement target signal wiring pattern 1, a pattern length of the measuring wiring pattern 6 is set to more than a definite length necessary for the measurement. It is usual that the pattern length is longer than the pattern length of each signal wiring pattern which is used for an actual signal transmission.

A measurement of the characteristic impedance is effected by applying a probe between the measuring wiring pattern 6 and the pad 5 and flowing a measuring signal therebetween. If a pattern length of the measuring wiring pattern 6 is sufficiently long, it is possible to measure the characteristic impedance at a state in which the measuring signal is stable. From a result of the measurement of the characteristic impedance of the measuring wiring pattern 6, a characteristic impedance of the measurement target signal wiring pattern 1 can be known.

Figure 3:
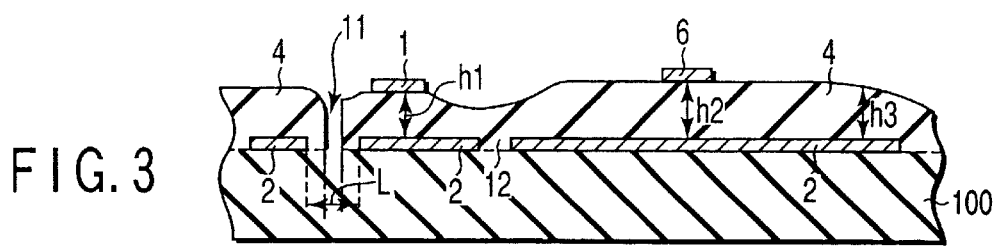
FIG. 3 is a view showing a relationship between a pattern of a plain layer and a film thickness of an insulating layer in the print board of the embodiment.

FIG. 3 shows a cross-sectional structure of the measurement target signal wiring pattern portion and a measuring wiring pattern portion. Around the measurement target signal wiring pattern 1, there are a via hole 11 for an interlayer hole or a through hole and the slit 12 which is used for separating the plain layer 2 into a power source layer and a ground layer. As the positions of the via holes 11 and slits 12 are determined by a wiring pattern layout, they are almost common between the same kind of signal wiring pattern.

The clearance L which is formed around the via hole 11 and the slit 12 are portions in which the plain layer 2 is absent, that is, a conductor does not exist. When the insulating layer 4 is formed on the plain layer 2, as the insulating material flows into a no-conductor portion (clearance L and slit 12), the thickness h1 of the insulating layer 4 in the neighborhood of the measurement target signal wiring pattern 1 around the no-conductor portion becomes thinner than the thickness h2 of the insulating layer 4 in the neighborhood of the measuring wiring pattern 6. The periphery of the print board (the right side of the figure, in this case) is in advance scraped off such that the side of the plain layer 2 may not be exposed outward and thus a thickness h3 of the insulating layer 4 at that portion is thinner to some extent compared with h2.

When an impedance of the measuring wiring pattern 6 is measured in this condition, a measuring result other than an actual characteristic impedance of the measurement target signal wiring pattern 1 is obtained. In order to coincide a characteristic impedance of the measuring wiring pattern 6 and that of the measurement target signal wiring pattern 1, a copper-containing amount of the plain layer 2 beneath the measurement target signal wiring pattern 1 is coincided with a copper-containing amount of the plain layer 2 beneath the measuring wiring pattern 6 in the embodiment of the present invention.

Next, two examples that a difference between a copper-containing amount of the insulating layer 4 beneath the measurement target signal wiring pattern 1 and a copper-containing amount of the insulating layer 4 beneath the measuring wiring pattern 6, can be made as small as possible, will be described as follows.

First, a first example that a conductive material removal area is formed on the plain layer 2 beneath the measuring wiring pattern 6 will be described.

Figure 4:
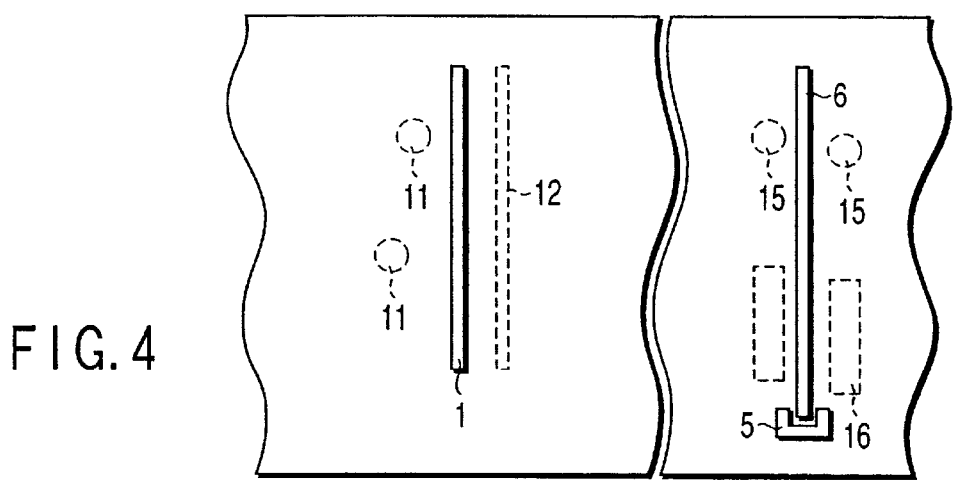
FIG. 4 is a view showing a first example of a patterning form of the plain layer around the measuring wiring pattern in the print board of the embodiment.

FIG. 4 is a plan view of the print board. As shown in FIG. 3, the clearance L of the via hole 11 and the slit 12 are formed in the plain layer 2 at the neighborhood of the measurement target signal wiring pattern 1 and the plain layer is removed at that portion. A copper-containing amount is calculated within a predetermined area defined with respect to the measurement target signal wiring pattern 1. A copper foil removal area which has the same copper-containing amount as the predetermined area is formed in the plain layer 2 in the neighborhood of a forming area of the measuring wiring pattern 6. In FIG. 4, as a copper foil removal area, two cutout portions 16 and two via holes 15 for a pseudo through-hole or interlayer hole are formed and thereby a copper-containing amount of the plain layer 2 beneath the measurement target signal wiring pattern 1 is coincided with a copper-containing amount of the plain layer 2 beneath the measuring wiring pattern 6. It is preferable that the cutout portions 16 and via holes 15 are not formed at concentrate, but are uniformly formed around beneath the forming area of the measuring wiring pattern 6.

Figure 5:
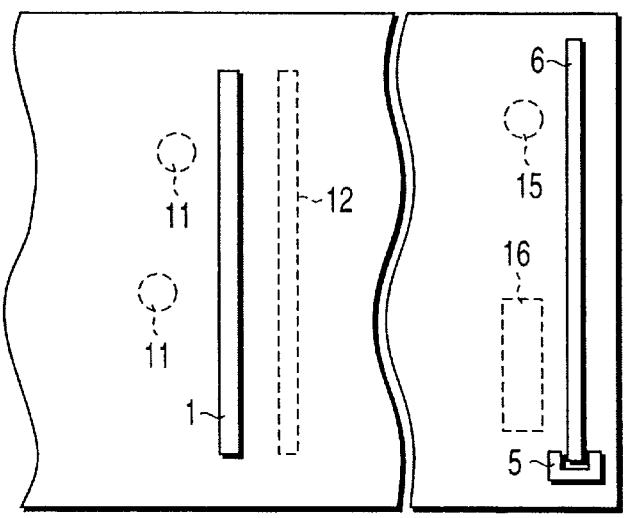
FIG. 5 is a view showing a second example of a patterning form of the plain layer around the measuring wiring pattern in the print board of the embodiment.

A process for an effective forming of a conductive material removal area will be described as follows. FIG. 5 shows an example which utilizes a periphery which originally has a low copper-containing amount. The measuring wiring pattern 6 is formed at a periphery. At the periphery of the print board, the plain layer 2 is not present and the copper-containing amount is originally low. Such being the case, by forming the measuring wiring pattern 6 at the periphery, an area of the copper foil removal area which is formed for adjusting the copper-containing amount is kept down. The copper foil removal areas 15 and 16 which are formed for adjusting a copper-containing amount are preferably formed more inside than the measuring wiring pattern 6 as shown in FIG. 5. Compared FIG. 4 with FIG. 5, it will be understood that an area of the removal region is reduced to about a half.

Such construction is especially effective with respect to a high density of print board when the measuring wiring pattern should be formed at the periphery of the print board.

Figure 6:
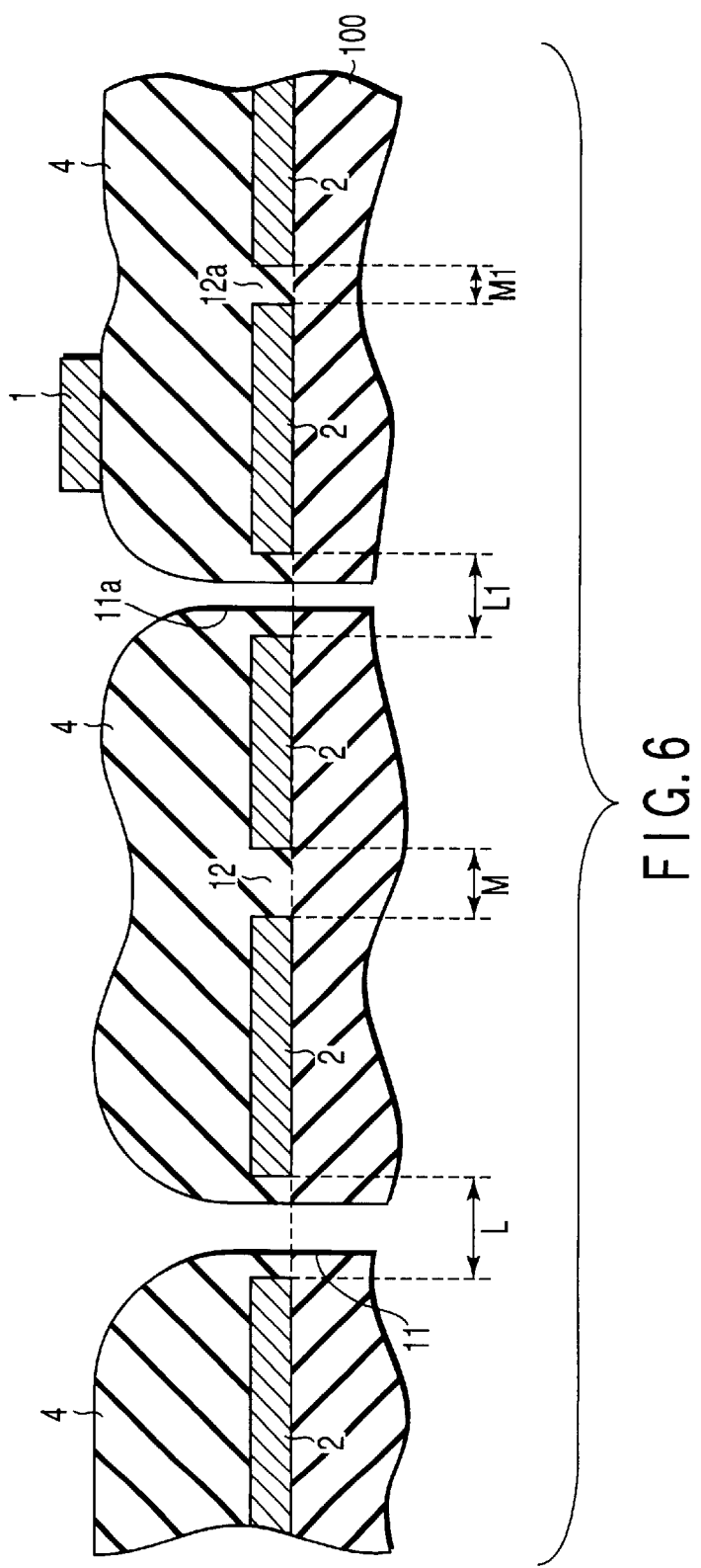
FIG. 6 is a view showing the diameter of a via hole clearance or the width of a slit in the print board of the embodiment.

Next, as a second method, an example that the clearance diameter of a via hole or the width of a slit in a forming area of the measurement target signal wiring pattern 1 is set to smaller value than a reference value of the clearance diameter of the via hole or the width of the slit in a forming region of another signal wiring pattern, will be shown in FIG. 6.

Generally, the clearance diameter of the via hole 11 is determined by a reference value L. Nevertheless, regarding a via hole 11a in the forming area of the measurement target signal wiring pattern 1, the clearance diameter L1 is set to a value as small as possible (L1<L). As is the same, regarding the width of the slit, a slit 12a in the forming area of the measurement target signal wiring pattern 1 is set to a smaller value M1 than a reference value M. Thereby, a difference between the copper-containing amount in the forming area of the measurement target signal wiring pattern 1 and the copper-containing amount in the forming area of the measuring wiring pattern 6 can be reduced to reduce a measuring error of the characteristic impedance of the measurement target signal wiring pattern 1.

Further, the above two methods can be used jointly.

As described above, in the print board of the present embodiment, a pattern of the plain layer 2 is determined based on not only the wiring pattern layout, but also a requirement such that the copper-containing amount of the plain layer 2 in the forming area of the measurement target signal wiring pattern 1 and the copper-containing amount of the plain layer 2 in the forming area of the measuring wiring pattern 6 may be coincided. Therefore, the characteristic impedance of the signal wiring pattern portion and the measuring wiring pattern portion can be coincided and the following advantageous effects can be obtained.

1) A reliability of the measured data in the measuring wiring pattern is established.
2) The characteristic impedance is easily controlled.
3) A check of a print board in the course of mass production is easily effected and measured data is reliable.
4) The end of the print board is utilized effectively.

Figure 7:
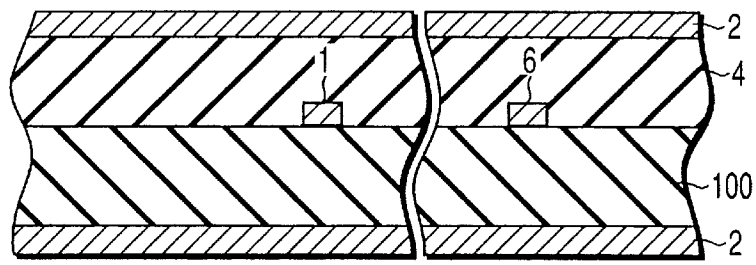
FIG. 7 is a view showing a sectional structure of a print board according to a first modification of the embodiment.

In the above embodiment, only a microstrip line structure is described in which the wiring pattern layer is formed on the insulating layer 4, but to a strip line structure in which the wiring pattern layer is formed in an inner layer, as shown in FIG. 7, the present invention is applicable. In FIG. 7, the core 100 and the insulating layer 4 are sandwiched between the upper and lower plain layers 2 and the wiring pattern layer including the signal wiring pattern 1 and the measuring wiring pattern 6 is formed in the insulating layer 4 which is formed on the core 100.

Figure 8:
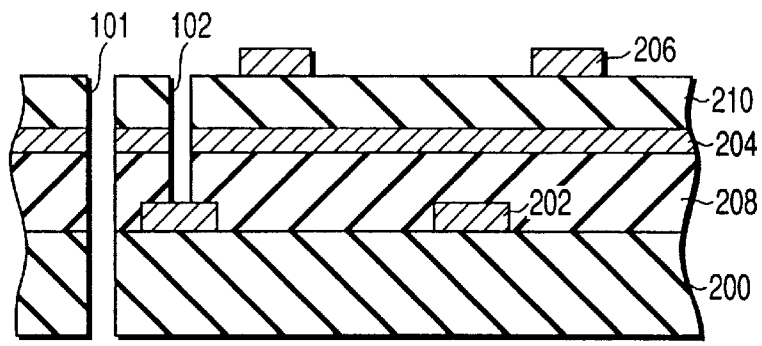
FIG. 8 is a view showing a sectional structure of a print board according to a second modification of the embodiment.

Also to a multi-layer structure shown in FIG. 8 of the print board, the present invention can be applied.

A print board shown in FIG. 8 is of a structure that a wiring pattern layer 202, a plain layer (ground layer) 204, a wiring pattern layer 206 are laminated via insulating layers 208 and 210 on a core 200. In this print board, based on an existence of a pattern of the wiring pattern layer 202 on the core 200, and a through hole 101 and an interlayer hole 102 or the like formed through the ground layer 204, thicknesses of insulating layers between each layers become non-uniform. Therefore, when a measuring wiring pattern is formed, using the same procedure as the above described embodiment, an adjustment of a copper-containing amount is necessary. That is to say, in case of a structure which an insulating layer is sandwiched with a conductive layer, the structure of the present embodiment can be applied to many kinds of print boards.

Figure 9:
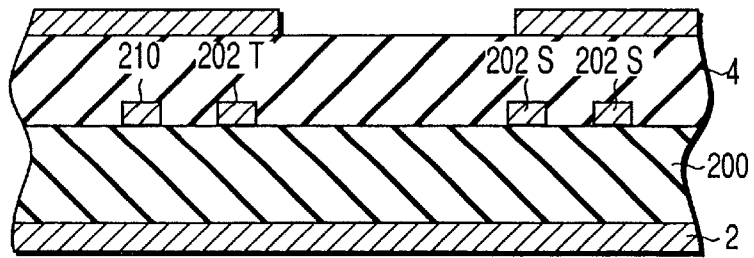
FIG. 9 is a view showing a sectional structure of a print board according to a third modification of the embodiment.

FIG. 9 is a modification of FIG. 8. Contrary to FIG. 8, the measurement target signal wiring pattern 202S and the measuring wiring pattern 202T are formed on the wiring pattern layer 202 in the insulating layer 4 which is formed on the core 200 in the modification shown in FIG. 9. An arbitrary-formed pseudo wiring pattern 210, which is the same as the measurement target signal wiring pattern 202S, is formed on the wiring pattern layer 202 in the neighborhood of the measuring wiring pattern 202T, and thereby a copper-containing amount of the wiring pattern layer 202S on the core 200 may be uniform.

As described above, according to the present invention, a measuring error of the characteristic impedance based on a change of a thickness in an insulating layer would be reduced and using a measuring wiring pattern, a correct measurement of the characteristic impedance regarding a measuring target signal wiring pattern may be easily implemented.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. Inventions of various stages are included in the above embodiment, and various inventions can be extracted from suitable combinations of a plurality of constitutions or elements which have been disclosed in the embodiment. For example, even when some constitutions are removed from of all the constitutions which have been disclosed in the embodiment, the problem to be solved by the invention, which has been described in the summary of the invention, can be solved by the remaining constitutions. Also, when at least one of the effects can be attained, such constitutions can be extracted as the invention.

What is claimed is:

1. A print board comprising:
   a patterned conductive layer which is patterned on a first insulating layer;
   a second insulating layer formed on said first insulting layer and patterned conductive layer; and
   a wiring pattern layer formed on said second insulating layer, wherein
      said wiring pattern layer comprises a measurement target signal wiring pattern for which characteristic impedance is to be measured and a measuring wiring pattern through which a measuring signal for measuring the characteristic impedance of said measurement target signal wiring pattern is flowed, and
      said patterned conductive layer comprises a first pattern above which said measurement target signal wiring pattern is formed and a second pattern above which said measuring wiring pattern is formed, the density of a conductive material first pattern being approximately the same as the density of a conductive material of said second pattern.

2. The print board according to claim 1, wherein said first pattern includes a conductive material removal area from which a conductive material is removed.

3. The print board according to claim 2, wherein said conductive material removal area is a via hole for an interlayer hole or a through hole, or a cutout portion.

4. The print board according to claim 2, wherein said conductive material removal area is located more inside than said measuring wiring pattern.

5. The print board according to claim 1, wherein a diameter of a via hole for an interlayer hole or a through hole in the first pattern is smaller than a diameter in the second pattern.

6. The print board according to claim 2, wherein a diameter of a via hole for an interlayer hole or a through hole in the first pattern is smaller than a diameter of the via hole in the second pattern.

7. The print board according to claim 1, wherein a slit width for separating the conductive layer in the first pattern is smaller than a slit width in the second pattern.

8. The print board according to claim 2, wherein a slit width for separating the conductive layer in the first pattern is smaller than a slit width in the second pattern.

9. The print board according to claim 1, wherein said conductive layer comprises at least one of a power source pattern and ground pattern.

* * * * *

UNITED STATES PATENT AND TRADEMARK OFFICE
CERTIFICATE OF CORRECTION

PATENT NO.   : 6,426,469 B2
DATED        : July 30, 2002
INVENTOR(S)  : Koga et al.

It is certified that error appears in the above-identified patent and that said Letters Patent is hereby corrected as shown below:

Column 8,
Line 1, change "first insulting" to -- first insulating --.

Signed and Sealed this

Eighth Day of April, 2003

JAMES E. ROGAN
*Director of the United States Patent and Trademark Office*